United States Patent
Park

(10) Patent No.: US 7,183,949 B2
(45) Date of Patent: Feb. 27, 2007

(54) ANALOG BASEBAND PROCESSOR AND METHOD OF PROCESSING ANALOG BASEBAND FOR USE IN MULTIMODE COMMUNICATION SYSTEM

(75) Inventor: Yang-Soo Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/152,455

(22) Filed: Jun. 14, 2005

(65) Prior Publication Data

US 2005/0280569 A1    Dec. 22, 2005

(30) Foreign Application Priority Data

Jun. 16, 2004  (KR) ..................... 10-2004-0044517

(51) Int. Cl.
*H03M 7/00* (2006.01)

(52) U.S. Cl. ........................................ 341/61; 341/155

(58) Field of Classification Search ................ 341/155, 341/144, 61; 375/316, 295; 455/73, 39
See application file for complete search history.

(56) References Cited

U.S. PATENT DOCUMENTS

| | | | |
|---|---|---|---|
| 5,153,532 A * | 10/1992 | Albers et al. ................. 331/78 |
| 5,859,878 A * | 1/1999 | Phillips et al. ............... 375/316 |
| 5,909,193 A * | 6/1999 | Phillips et al. ............... 342/410 |
| 6,600,438 B2 * | 7/2003 | Hilton ......................... 341/155 |
| 2002/0193090 A1 | 12/2002 | Sugar et al. ................. 455/343 |
| 2003/0050085 A1 | 3/2003 | Peluso et al. ................ 455/522 |

FOREIGN PATENT DOCUMENTS

| | | |
|---|---|---|
| KR | 2000-0033421 | 6/2000 |
| KR | 10-2001-0029220 A | 4/2001 |
| WO | WO 02/27953 A1 | 4/2002 |

* cited by examiner

*Primary Examiner*—Peguy JeanPierre
(74) *Attorney, Agent, or Firm*—F. Chau & Associates, LLC

(57) ABSTRACT

Analog baseband processors and methods of processing an analog baseband for use in a multimode communication device are disclosed. The analog baseband processor includes a single (shared) analog-to-digital converter, and at least a first receiver digital front end and a second receiver digital front end. The analog baseband processor may further include a third or more receiver digital front ends. The analog-to-digital converter is time-shared by the receiver digital front ends and (alternately) converts a first mode input signal to a first digital signal based at a first sampling rate and converts a second mode input signal to a second digital signal based at the (same) first sampling rate. The first receiver digital front end converts the first sampling rate of the first digital signal, and the second receiver digital front end converts the first sampling rate of the second digital signal.

23 Claims, 8 Drawing Sheets

ANALOG BASEBAND PROCESSOR AND METHOD OF PROCESSING ANALOG BASEBAND FOR USE IN MULTIMODE COMMUNICATION SYSTEM

CLAIM FOR PRIORITY

This application claims priority under 35 USC § 119 to Korean Patent Application No. 2004-44517, filed on Jun. 16, 2004, the contents of which are herein incorporated by reference in their entirety for all purposes.

BACKGROUND OF THE INVENTION

1. Field of the Invention

The invention relates to a mobile communication transmitter/receiver and a method of transmitting/receiving digital signals, and more particularly to an analog baseband processor and a method of processing an analog baseband in a multimode communication system.

2. Description of the Related Art

Multiple modes of wireless communications (i.e. mobile communication standards/protocols) are available to allow mobile terminals (e.g., cell phones, PDAs, laptop computers) communicate in a mobile communication network. These modes are implemented over communication protocols including global system for mobile communications (GSM), general packet radio service (GPRS), wideband code division multiple access (WCDMA), CDMA2000, and time division-synchronous code division multiple access (TD-SCDMA).

In general, in a digital communication system, an analog signal is converted to a digital signal or a digital signal to an analog signal.

In a digital communication system, an analog-to-digital conversion or digital-to-analog conversion is typically required (e.g., to reduce noise on a transmission path and to improve transmission performance).

FIG. 1 is a block diagram illustrating a conventional digital communication transmitter/receiver.

Referring to FIG. 1, the conventional digital communication transmitter/receiver includes an RF processor 102, an IF processor 104, an analog baseband (ABB) processor 106 and a digital baseband (DBB) processor 108.

The receiving/transmitting schemes of the related art are largely classified between a homodyne scheme and a heterodyne scheme. The heterodyne scheme uses an intermediate frequency (IF) signal having a lower frequency than a RF signal in the reception/transmission, so that, in the transmitting and receiving system, amplification may be easily performed and selectivity and fidelity may be high.

When the digital communication transmitter/receiver receives a radio frequency (RF) signal (reception mode), the RF processor 102 converts the radio frequency (RF) signal received from an antenna to an intermediate frequency (IF) (by heterodyne techniques), or alternatively converts the RF signal directly to a baseband frequency (Direct Conversion, using zero-intermediate-frequency; homodyne). When the digital communication transmitter/receiver transmits the radio frequency (RF) signal (transmission mode), the RF processor 102 modulates an IF signal or a baseband signal to the RF signal to transmit the RF signal through the antenna.

The IF processor 104 is employed in a heterodyne transmitter/receiver (using the intermediate frequency (IF) signal). During reception mode, the IF processor 104 converts the IF signal into the baseband frequency, and during transmission mode, the IF processor 104 converts the baseband signal into the IF signal.

During reception mode, the analog baseband (ABB) processor 106 performs analog-to-digital conversion of an analog baseband signal and converts the analog baseband signal into a digital baseband signal (at an appropriate sampling rate or sampling frequency). The converted baseband signal is transmitted to the digital baseband (DBB) processor 108. During transmission mode, the analog baseband (ABB) processor converts a digital signal into an analog baseband signal (by performing a digital-to-analog conversion ADC of the received digital signal) to output an analog baseband signal to the IF processor 104.

The digital baseband (DBB) processor 108 performs signal demodulation and channel decoding in the reception mode, and performs signal modulation and channel coding in the transmission mode.

FIG. 2 is a block diagram illustrating a conventional analog baseband processor.

Referring to FIG. 2, the conventional analog baseband processor 200 includes an analog baseband receiver section 210 and an analog baseband transmitter section 230.

The analog baseband receiver section 210 includes an analog-to-digital converter (ADC) 212 and a first digital front end 213. The first digital front end 213 includes a decimator 214 and a first sample rate converter 216.

The analog-to-digital converter (ADC) 212 converts an analog baseband signal to a digital baseband signal (using a first predetermined sampling rate to generate a discrete time signal). The first digital front end 213 filters the digital (discrete time) baseband signal (using a second predetermined sampling rate) to supply the filtered digital baseband signal to a digital baseband processor 240.

The decimator 214 includes a first low pass filter (LPF1) 2141 and a first down-sampler 2143. The decimator 214 reduces the sampling rate (frequency) of the converted digital baseband signal (discrete time signal). The decimator 241 resamples the discrete time signal (digital baseband signal). The decimation is performed using a first down-sampler 2143 having a down sampling factor R1 (R1 is an integer). Therefore, where the digital (discrete time) signal inputted to the decimator 214 has a sampling rate of f1, an (resampled) output signal of the decimator 214 has the sampling rate of f1/R1. Aliasing in the resampled discrete time signal is avoided by using the first low pass filter 2141 to filtering the discrete time signal.

The first sample rate converter 216 includes a first up-sampler 2161, a second low pass filter 2163 and a second down-sampler 2165 to perform a (second) sampling rate conversion (with a fractional factor). The first up-sampler 2161 has an up-sampling factor M1 so that an output signal of the decimator 214 is up-sampled with the factor M1 (M1 is an integer). The second low pass filter 2163 prevents aliasing due to the up sampling conversion. The second down-sampler 2165 has a down-sampling factor L1 so that an output signal of the second low pass filter 2163 is down-sampled by the factor L1 (L1 is an integer). Thus, the first sample rate converter 216 converts the sampling rate of the output signal of the decimator 214 with a sampling rate conversion factor M1/L1. Therefore, a signal outputted from the first sample rate converter 216 has a (converted) sampling rate of f1c equal to f1/R1×M1/L1. Thus, f1c=f1×M1/(R1×L1).

The analog baseband transmitter unit 230 includes a digital-to-analog converter 236 and a second digital front end 231 for transmission. The second digital front end 231 includes a second sample rate converter 232 and an interpolator 234. The second sample rate converter 232 converts the sampling rate of an output signal of the digital baseband processor 240 with a fractional factor (M2/L2). For example, when the output signal of the digital baseband processor 240 has a sampling rate of f2/P2×L2/M2 (i.e., f2×L2/(P2×M2)), the second sample rate converter 232 includes a second up-sampler 2321 having an up-sampling factor M2 (M2 is an integer), a third low pass filter 2323 (for preventing the aliasing due to the up conversion), and a third down-sampler 2325 having a down-sampling factor L2 (L2 is an integer) so that the output signal of the digital baseband processor 240 is up-sampled with the factor M2 and then down-sampled with the factor L2. Therefore, a signal outputted from the second sample rate converter 232 has a sampling rate of f2/P2.

The interpolator 234 includes a third up-sampler 2341 having an up-sampling factor P2 and a fourth low pass filter 2343. The output signal of the second sample rate converter 231, the output of the second down-sampler 2325, is up-sampled with the factor P2 by the third up-sampler 2341. The fourth low pass filter 2343 removes the aliasing due to the up conversion. Therefore, the sampling rate of an output signal of the interpolator 234 is f2.

The digital-to-analog converter 236 converts the digital signal (the output signal from the second sample rate converter 231) to an analog signal to transmit the converted analog signal to an RF signal processor or IF signal processor.

The sampling rate of a signal applied to the digital baseband processor 240 depends on the sampling rate f1 of the analog-to-digital converter 212, and upon the sampling factors R1, M1 and L1 of the first digital front end 213. In addition, the signal applied to the digital baseband processor 240 is also dependent on a communication protocol standard.

Similarly, the sampling rate of the output signal of the digital baseband processor 240 is also determined by the communication protocol standard.

For example, there are many different communication protocol standards, such as GSM communication standard of a time-division multiple access (TDMA) used in a digital communication system, and cdma2000 and W-CDMA communication standards of a code-division multiple access (CDMA) that are widely popular for $3^{rd}$ generaton wireless and cellular standards.

In a multimode communication system where various communication systems conforming to different communication standards are employed, parallel digital front ends for processing signals complying with the different communication standards are included with the analog baseband processors.

FIG. 3 is a block diagram illustrating a conventional analog baseband processor in a dual (two) mode receiver.

Referring to FIG. 3, the conventional analog baseband processor for the dual mode receiver includes a first analog-to-digital converter (ADC) 300 employed in a GSM/EDGE mode system, a first digital front end 310, and a second analog-to-digital converter (ADC) 340 employed in a W-CDMA mode system and a second digital front end 350. The conventional analog baseband processor of FIG. 3 includes two analog-to-digital converters 300 and 340, for two communication standards. The first analog-to-digital converter (ADC) 300 samples at first predetermined sampling rate (frequency) f1. The second analog-to-digital converter (ADC) 340 samples at second predetermined sampling rate (frequency) f2. Ordinarily, sampling rates f1 and f2 are not equal to each other.

The analog baseband processor of FIG. 3 selectively processes a GSM/EDGE signal or W-CDMA signal. Each of the two digital front ends 310 and 350 have configurations and functions similar to the digital front end (213) described in FIG. 2. The first digital front end 310 includes a first decimator 320 and a first sample rate converter 330. The first decimator 320 has a first low pass filter (LPF1) 322 and a first down-sampler 324. The first sample rate converter 330 has a first up-sampler 332, a second low pass filter 334 and a second down-sampler 336).

Similarly, the second digital front end 350 includes a second decimator 360 and a second sample rate converter 370. The second decimator 360 includes a third low pass filter 362 and a third down-sampler 364. The second sample rate converter 370 includes a second up-sampler 372, a fourth low pass filter 374 and a second down-sampler 376.

To support multiple communication standards (such as $2^{nd}$ generation GSM/EDGE (Enhanced Data rates for the GSM Evolution) and $3^{rd}$ generation W-CDMA in an IMT-2000 communication system), a receiver needs multiple analog-to-digital converters and multiple digital front ends (e.g., one analog-to-digital converter (ADC) having a predetermined sampling rate for each of the different communication standards).

However, when two or more communication systems are incorporated into a dual mode or multimode transmitter/receiver, the chip size may be increased and design complexity may be also increased due to the increased number of analog-to-digital converters (ADCs) and digital front ends.

SUMMARY OF THE INVENTION

Example embodiments of the invention provide analog baseband processors for use in multimode communication devices.

In some embodiments of the invention, the analog baseband processor includes a single analog-to-digital converter for alternating use in processing each of a plurality of signals of different modes (e.g., GSM/EDGE, CDMA-2000, GPS, etc.) The analog baseband processor may further include, a first receiver digital front end and a second receiver digital front end, each operatively coupled to the same analog to digital converter (ADC). The analog-to-digital converter (ADC) alternately converts a first mode input signal to a first digital signal based on (at) a first sampling rate and converts a second mode input signal to a second digital signal based on (at) the first sampling rate. The first receiver digital front end converts the sampling rate of the first digital signal and the second receiver digital front end converts the sampling rate of the second digital signal (into the same sampling rate). For example, the first receiver digital front end includes a first decimator configured to convert the sampling rate of the first digital signal with a conversion factor of R1, R1 being an integer; and a first sample rate converter configured to convert a sampling rate of an output signal of the first decimator with a conversion factor of M1/L1, M1 and L1 being integers. For example, the second receiver digital front end includes a second decimator configured to convert a sampling rate of the second digital signal with a conversion factor of R2, R2 being an integer; and a second sample rate converter configured to convert a sampling rate of an output signal of the second decimator with a conversion factor of M2/L2, M2 and L2 being integers. For example, the first sampling rate×M1/(L1×R1) equals the about 1.625/N1 Msps (Mega samples per second) according to a GSM/EDGE standard, where N1 is an integer greater than one; and the first sampling rate×M2/(L2×R2) equals the about 3.84×N2 Msps (Mega samples per second) according to a W-CDMA standard, where N2 is an integer greater than one. The above variables N1, N2, R1, M1, L1, R2, M2 and L2 are determined or predetermined such that $1.625×10^6 × (R1×L1)/(M1×N1)$ equals to $3.84×10^6 ×(N2×R2×L2)/M2$.

In other example embodiments of the invention, the analog baseband processor for use in a multimode device includes a first transmitter digital front end, a second transmitter digital front end and a shared digital-to-analog converter. The first transmitter digital front end converts the sampling rate of a first digital input signal. The second transmitter digital front end converts the sampling rate of a second digital input signal. The digital-to-analog converter alternately converts an output signal of the first transmitter digital front end to a first analog signal and converts an output signal of the second transmitter digital front end to a second analog signal, the output signal of the first transmitter digital front end and the output signal of the second transmitter digital front end respectively having the same (e.g., the same first shared) sampling rate.

In other example embodiments of the invention, the analog baseband processor for use in a multimode device includes an shared analog-to-digital converter; a first receiver digital front end, a second receiver digital front end, a first transmitter digital front end, a second transmitter digital front end and a shared digital-to-analog converter. The shared analog-to-digital converter alternately converts a first mode input signal to a first digital signal based at a first sample rate and converts a second mode input signal to a second digital signal based at the first sample rate. The first receiver digital front end converts the first sampling rate of the first digital signal and the second receiver digital front end converts the first sampling rate of the second digital signal. The first transmitter digital front end converts a sampling rate of a first digital input signal and the second transmitter digital front end converts a sampling rate of a second digital input signal. The (shared) digital-to-analog converter alternately converts an output signal of the first transmitter digital front end into a first analog signal and alternately converts an output signal of the second transmitter digital front end to a second analog signal, the output signal of the first transmitter digital front end and the output signal of the second transmitter digital front end having the same (e.g., the first) sample rate.

Example embodiments of the invention may also provide a method of processing an analog baseband for use in a multimode communication system. According to some embodiments of the invention, in the method, a first mode input signal is converted to a first digital signal based at a first sampling rate and a second mode input signal is converted to a second digital signal based at the first sample rate. The first sampling rate of the first digital signal is converted to a second sampling rate and the first sampling rate of the second digital signal is converted to a third sampling rate. The method may further include converting a third mode input signal to a third digital signal (at the same first sample rate); and converting the (first) sampling rate of the third digital signal so that the third digital signal has a fourth sampling rate.

According to other example embodiment of the invention, in the method of processing an analog baseband for use in a multimode communication system, a sampling rate of a first digital signal (to be transmitted) is converted so that the first digital input signal has a first sampling rate. A sampling rate of a second digital input signal is converted to the first sampling rate; and the converted first and second digital signal is converted to a first analog signal or a second analog signal, respectively (from the first sampling rate). The method may further include converting a sampling rate of a third digital signal so that the third digital input signal has the first sampling rate.

BRIEF DESCRIPTION OF THE DRAWINGS

The invention will become more apparent to those of ordinary skill in the art by describing, in detail, example embodiments thereof with reference to the attached drawings, wherein like elements are represented by like reference numerals (or by like element labels), which are given by way of illustration only and thus do not limit the example embodiments of the invention, and.

DETAILED DESCRIPTION OF THE EXAMPLE EMBODIMENTS

Figure 4:
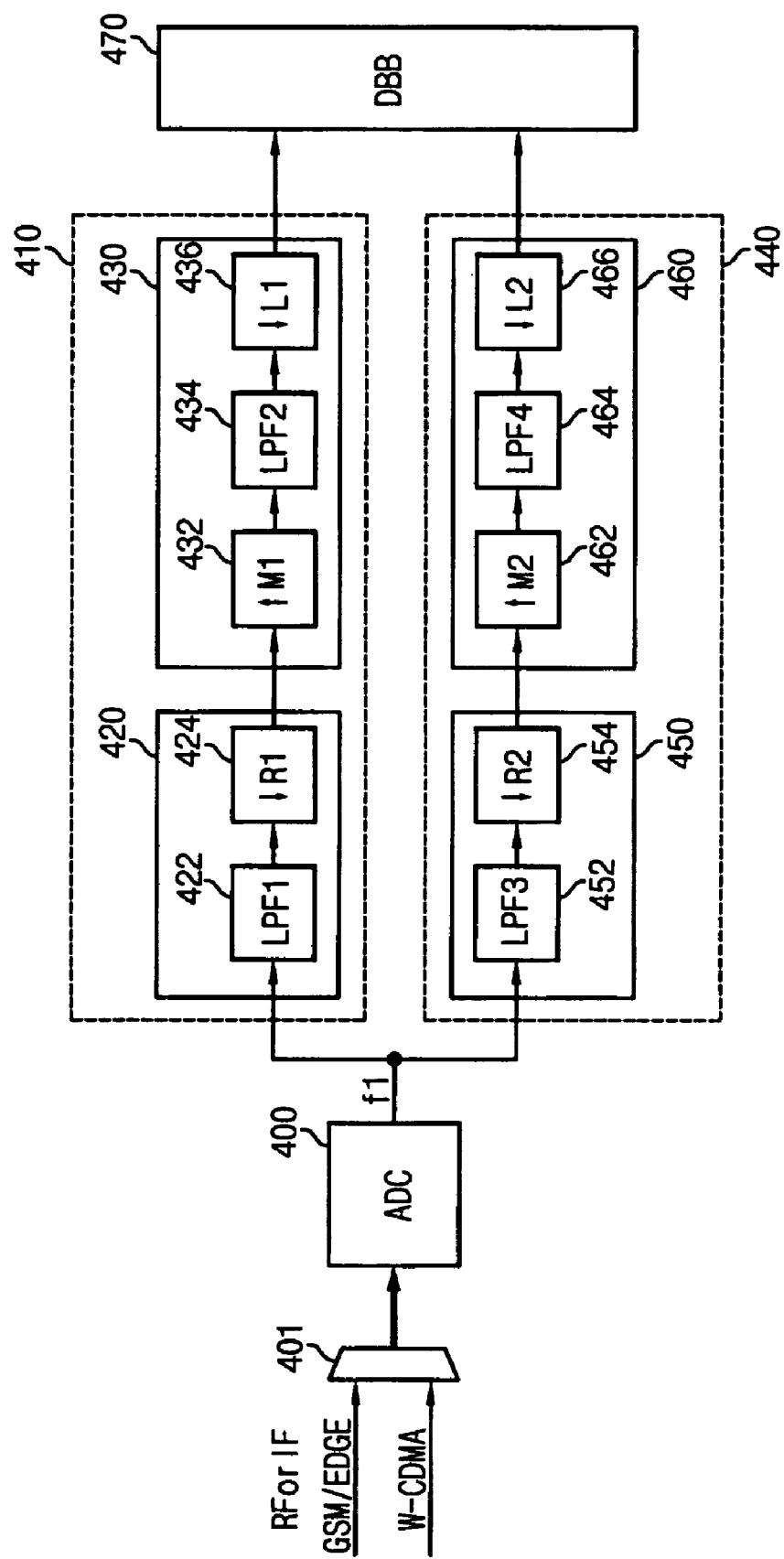
FIG. 4 is a block diagram illustrating an analog baseband processor in a multimode receiver according to an example embodiment of the invention.

FIG. 4 is a block diagram illustrating an example analog baseband processor in a multimode receiver according to an embodiment of the invention.

Referring to FIG. 4, the analog baseband processor in the multimode receiver includes a switching unit (e.g., multiplexer) 401, a single analog-to-digital converter (ADC) 400, a first digital front end 410 and a second digital front end 440.

The switching unit (e.g., multiplexer) 401 receives a first mode (e.g., GSM/EDGE) input signal and a second mode (e.g., W-CDMA) input signal, and selectively outputs a selected one of the first and second mode input signals. The first and second mode input signals may be analog RF signal or IF signal. For example, the first mode input signal may be a GSM/EDGE RF (or IF) signal, and the second mode input signal may be W-CDMA RF (or IF) signal.

The analog-to-digital converter (ADC) 400 converts an output of the switching unit 401 (a selected one of the first and second mode input signals) into a digital (discrete time) signal having a sampling rate (or sampling frequency) of f1 using a sampling frequency f1.

The first digital front end 410 includes a first decimator 420 and a first sample rate converter 430, and converts the sampling rate fi of the digital signal with a fractional conversion factor. The first decimator 420 includes a first low pass filter 422 that has a predetermined cut-off frequency to avoid aliasing in the converted digital signal. The first decimator 420 further includes a first down-sampler 424 for down-sampling the sampling rate f1 of the received digital signal with an integer down-sampling factor (R1). For example, the first down-sampler 424 down-samples the sampling rate f1 of the received digital signal with a down-sampling factor of R1 (R1 is an integer).

The first sample rate converter 430 converts the sampling rate of an output signal from the first decimator 420 with a conversion factor of M1/L1. The first sample rate converter 430 includes a first up-sampler 432 for up-sampling the sampling rate (f1/R1) of the output signal of the first decimator 420 with an up-sampling factor of M1. The first sample rate converter 430 further includes a second low pass filter (LPF2) 434 that has a predetermined cut-off frequency so as to prevent aliasing in an output signal of the first up-sampler 432. An output signal of the second low pass filter (LPF2) 434 is input to a second down-sampler 436. The second down-sampler 436 down-samples the sampling rate of the output signal of the second low pass filter 434 with a down-sampling factor L1. Therefore, the first sample rate converter 430 converts the sampling rate (f1/R1) of the output signal of the first decimator 420 with the conversion factor M1/L1. Thus, the first digital front end 410 converts the sampling rate (f1) of the output signal of the first decimator 420 with the conversion factor M1/(L1×R1)

The first digital front end 410 can process a GSM/EDGE signal. In the GSM/EDGE standard, a digital baseband processor 470 samples an input or output signal at a sampling rate of about 1.625/N1 (N1 is an integer greater than one) Msps (Mega samples per second). Thus, the sampling rate f1×M1/(L1×R1) (where R1, M1, and L1 are integers greater than one) of a signal inputted to the digital baseband processor 470 equals to about 1.625/N1 Msps.

The second digital front end 440 converts the sampling rate f1 of the received digital signal with a second fractional factor. The second digital front end 440 includes a second decimator 450 and a second sample rate converter 460.

The second decimator 450 includes a third low pass filter (LPF3) 452 for filtering the received digital signal and a second down-sampler 454 for down-sampling the sampling rate of the received digital signal with a down-sampling factor of 1/R2 (R2 is an integer).

The second sample rate converter 460 converts an output signal of the second decimator 450 with a conversion factor of M2/L2. The second sample rate converter 460 includes a second up-sampler 462, a fourth low pass filter (LPF4) 464 and a fourth down-sampler 466. The output signal of the second decimator 450 is up-sampled with an up-sampling factor of M2 by the second up-sampler 462 and is then inputted to be filtered by the fourth low pass filter (LPF4) 464 having a predetermined cut-off frequency so as to avoid aliasing. The filtered signal is then down-sampled with a down-sampling factor of L2 by the fourth down-sampler 466. Therefore, a signal provided to the digital baseband processor 470 has the sampling rate of f1×M2/(L2×R2).

In this embodiment, the second digital front end 440 may be employed in the W-CDMA system and so the output of the second sample rate converter 460 may be inputted to a W-CDMA digital baseband processor in the digital baseband processor 470. When operating according to the W-CDMA standard, the digital baseband processor 470 samples an input or output signal at a sampling rate of 3.84×N2 (N2 is an integer greater than one) Msps (Mega samples per second). Thus, when operating according to the W-CDMA standard, the sampling rate f1×M2/(L2×R2) (where R2, M2, and L2 are integers greater than one) of a signal inputted to the digital baseband processor 470 equals 3.84×N2 Msps.

The two digital front ends 410 and 440 can share the same analog-to-digital converter (ADC 400) because they have the sampling rate f1 (of the analog-to-digital converter 400). When variables such as f1, R1, M1, K1, R2, M2, L2 and N2 are appropriately selected, the common analog-to-digital converter 400 shared by the two digital front ends 410 and 440 may be alternately used by each so that the two signals of different modes (such as the GSM/EDGE signal and the W-CDMA signal) may be alternately processed.

Figure 1:
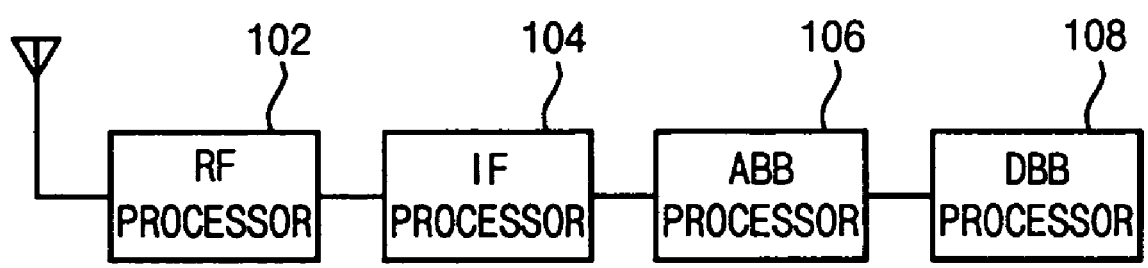
FIG. 1 is a block diagram illustrating a conventional digital transmitter/receiver.
Figure 2:
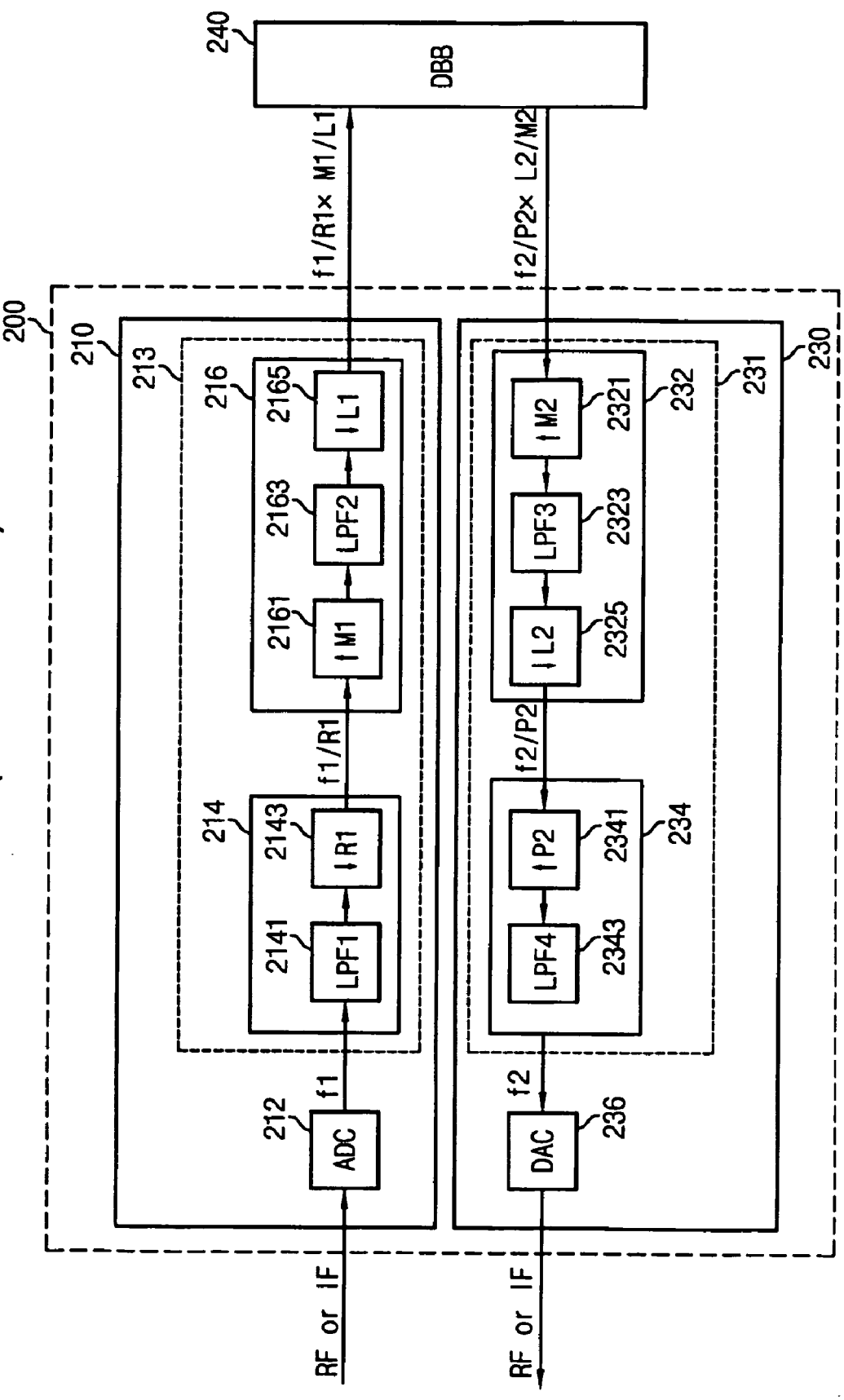
FIG. 2 is a block diagram illustrating a conventional analog baseband processor in a single mode digital transmitter/receiver.
Figure 3:
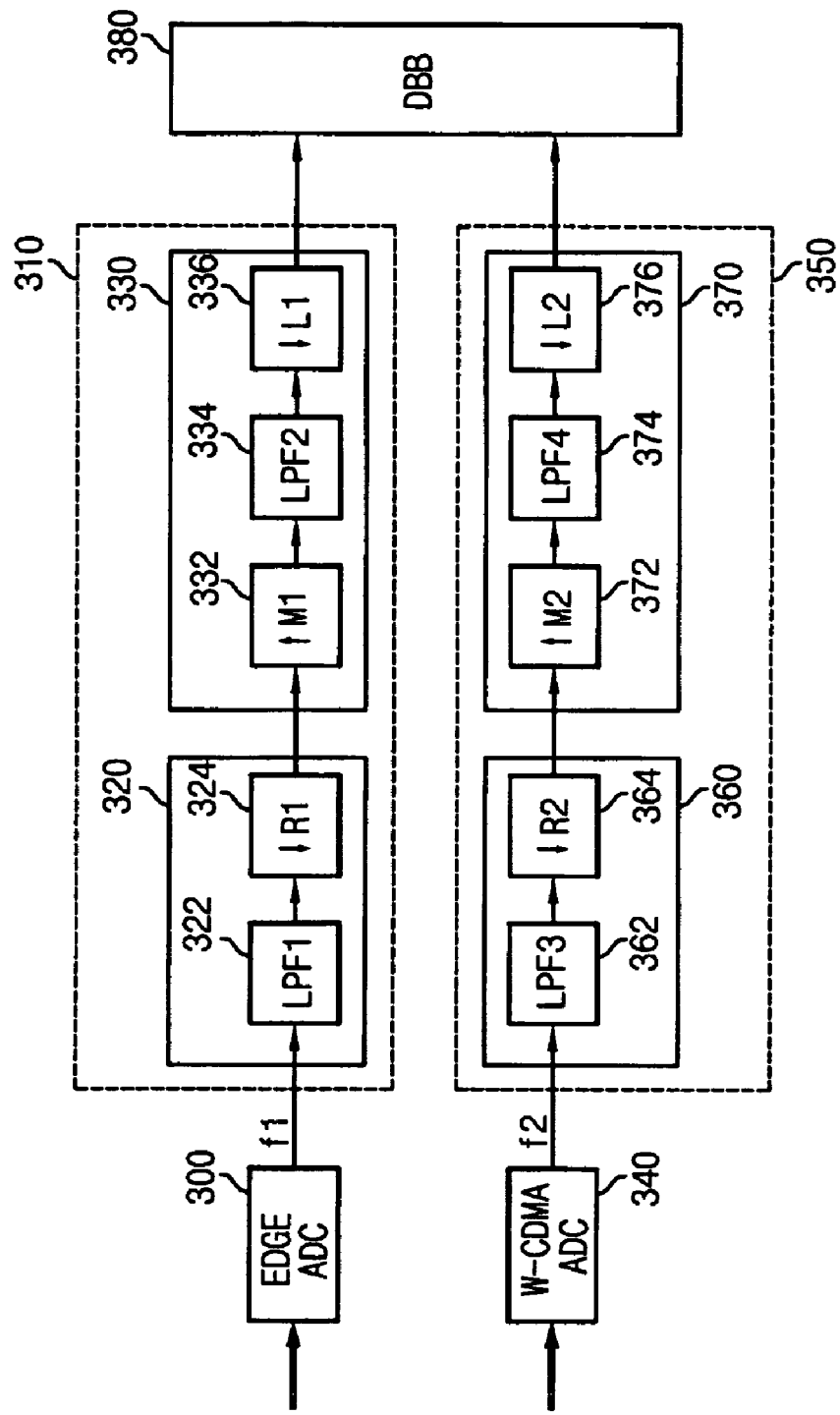
FIG. 3 is a block diagram illustrating a conventional analog baseband processor in a dual mode receiver.

Thus, according to an example embodiment of the invention, it is not necessary to provide two analog-to-digital converters ADCs (see 300 and 340 in FIG. 3) in order to alternately process a GSM/EDGE signal and a W-CDMA signal. Instead, one analog-to-digital converter (ADC 400) need be utilized to selectively process the two signals in different modes of operation. For example, the first digital front end 410 is employed to process a GSM/EDGE signal when the GSM/EDGE signal is received, and the second digital front end 440 is employed to process a W-CDMA signal when the W-CDMA signal is received. When the first digital front end 410 is activated to process the GSM/EDGE signal, the second digital front end 440 stops signal processing. When the second digital front end 440 is activated to process the W-CDMA signal, the first digital front end 410 stops signal processing.

The sampling rate f1 of the analog baseband processor, in particular the sampling rate fi of the analog-to-digital converter (ADC 400) may be predetermined to have an acceptable range, and then the values of other remaining variables (N1, N2, R1, M1, L1, R2, M2 and L2) may be determined as follows:

First, the sampling rate f1 of the analog-to-digital converter may be predetermined.

For example, the sampling rate f1 may be limited to an acceptable range such as a range between about 25 MHz and about 35 MHz.

Next, the variables N1 and N2 for input sampling rates of the GSM/EDGE and W-CDMA digital baseband processors may be determined.

For example, N1 is set to six and N2 is set to two.

Next, the variables R1, M1, L1, R2, M2 and L2 for the sampling rate of the respective decimators and the sample rate converters may be determined.

There are a number of integers for the variables R1, M1, L1, R2, M2 and L2 satisfying the condition f1/R1*M1/L1=1.625/N1 Msps (for processing GSM/EDGE signals) and the condition f1/R2*M2/L2=3.84*N2 Msps (for processing W-CDMA signals). The variables may be selected so as to decrease hardware complexity. When both the up-sampler and the down-sampler are used for the sampling converter, the sampling rate of the up-sampler has a greater influence on the hardware complexity of the sample rate converter than the sampling rate of the down-sampler. Therefore, to decrease the design complexity of the digital front end, the variables M1 and M2 (i.e., the sampling rates of the respective up-samplers) may be selected to be as small as possible. The hardware complexity may also be decreased, when the variables (R1, L1, R2, and L2) for the sampling rates of the respective down-samplers are selected to be small.

In addition, although the discussion herein is mainly directed to a method of selecting the variables such that hardware complexity may be reduced, it is apparent to those skilled in the art that the variables may be also selected according to other criteria (e.g., so as to improve the accuracy of signal transmission).

Next, a set of the variables such that satisfy the following expression 1 may be determined using Expression 1.

$$f1=1.625\times10^6/N1\times R1/M1\times L1=3.84\times10^6\times N2\times R2/M2\times L2 \quad \text{[Expression 1]}$$

Next, among sets of the variables satisfying Expression 1, a set of variables that provide the smallest value of M1+M2+R1+L1+R2+L2 may be selected when the sampling rate f1 is given.

Steps performed for selecting the above variables may be implemented by the following pseudo code.

[Pseudo Code]

```
N1=6
N2=2
for R1=1:50
  for M1=1:50
    for L1=1:50
      f1 = (1.625 / N1) * R1 * L1 / M1
      if f1 >= 25 & f1 < 35
        for R2=1:50
          for M2=1:50
            for L2=1:50
              f2 = (3.84 * N2) * R2 * L2 / M2
              if f1 == f2
                f1,R1,M1,L1,R2,M2,L2,M1+M2,R1+L1+R2+L2
              end
            end
          end
        end
      end
    end
  end
end
```

The following table 1 shows respective sets of the variables satisfying Expression 1 when N1 is set to 6 and N2 is set to 2.

TABLE 1

| F1(MHz) | R1 | M1 | L1 | R2 | M2 | L2 | M1 + M2 | R1 + L1 + R2 + L2 |
|---|---|---|---|---|---|---|---|---|
| 27.7333 | 16 | 5 | 32 | 5 | 18 | 13 | 23 | 66 |
|  | 32 | 5 | 16 | 13 | 18 | 5 | 23 | 66 |
| 28.0 | 32 | 13 | 42 | 7 | 48 | 25 | 61 | 106 |
|  | 32 | 13 | 42 | 25 | 48 | 7 | 61 | 106 |
|  | 42 | 13 | 32 | 7 | 48 | 25 | 61 | 106 |
|  | 42 | 13 | 32 | 25 | 48 | 7 | 61 | 106 |
| 30.0 | 36 | 13 | 40 | 5 | 32 | 25 | 45 | 106 |
|  | 36 | 13 | 40 | 25 | 32 | 5 | 45 | 106 |
| 31.2 | 24 | 5 | 24 | 5 | 16 | 13 | 21 | 66 |
|  | 24 | 5 | 24 | 13 | 16 | 5 | 21 | 66 |
| 32.0 | 32 | 13 | 48 | 5 | 6 | 5 | 19 | 90 |
|  | 48 | 13 | 32 | 5 | 6 | 5 | 19 | 90 |

Although in FIG. 4 the GSM/EDGE signal and the W-CDMA signal are shown inputted to the analog-to-digital converter (ADC 400) for selectively processing a selected one of two mode signals, it is apparent to those skilled in the art that the analog baseband processor of FIG. 4 may selectively process any two mode signals (e.g., any two of the GSM/EDGE signal, the W-CDMA signal and the cdma-2000 signal).

Further, the invention may be adapted to process various known or future communication systems mode signals such as GSM/EDGE, W-CDMA, cdma-2000, GPS, Bluetooth, W-LAN.

The following Table 2 shows respective sets of the variables R1, M1, L1, R2, M2 and L2 in an embodiment where one analog-to-digital converter 400 of FIG. 4 and two digital front ends (410 and 440) are configured to selectively process an analog cdma-2000 and an analog GPS signal into digital signals.

TABLE 2

| f1(MHz) | R1 | M1 | L1 | R2 | M2 | L2 |
|---|---|---|---|---|---|---|
| 31.744 | 5 | 48 | 31 | 16 | 33 | 16 |
| 33.792 | 5 | 16 | 11 | 16 | 31 | 16 |
|  | 11 | 16 | 5 | 16 | 31 | 16 |

In Table 2, N1, R1, M1 and L1 are the variables for processing the cdma-2000 signal and N2, R2, M2 and L2 are the variables for processing the GPS signal. In addition, N1 is set to 8 and N2 is set to 4.

Figure 5:
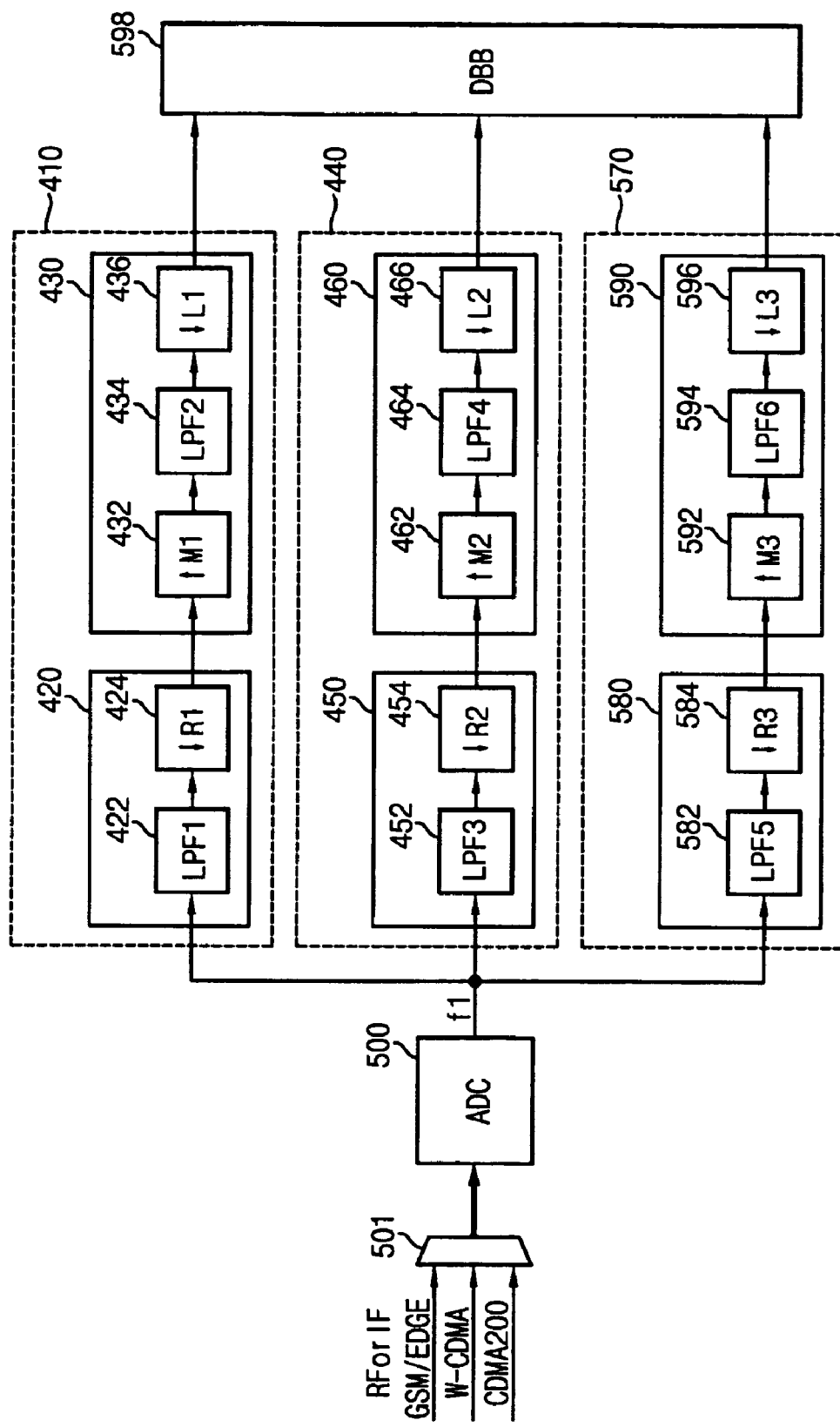
FIG. 5 is a block diagram illustrating an analog baseband processor in a multimode receiver according to another example embodiment of the invention.

FIG. 5 is a block diagram illustrating an analog baseband processor in a multimode receiver according to another example embodiment of the invention.

Referring to FIG. 5, the analog baseband processor in the multimode receiver in FIG. 5 is the same as the analog baseband processor in FIG. 4 except for a larger switching unit (e.g., multiplexer) 501 and a third digital front end 570 (e.g., for processing a cdma-2000 signal). The same reference numerals denote similar or identical elements in FIG. 4. Therefore, only the switching unit 501 and the third digital front end 570 will be described and the description of the first and second digital front ends 410 and 440 will be omitted.

The switching unit (e.g., multiplexer) 501 receives a first mode input signal, a second mode input signal and a third mode input signal to output a selected one of the first, second and third mode input signals. The first, second and third mode input signals may be analog RF signal or IF signal. For example, the first mode input signal may correspond to GSM/EDGE RF (or IF) signal, the second mode input signal may correspond to W-CDMA RF (or IF) signal, and the third mode input signal may correspond to CDMA-2000 RF (or IF) signal.

The third digital front end 570 includes a third decimator 580 and a third sampler rate converter 590.

The third decimator 580 includes a fifth low pass filter (LPF5) 382 for filtering an output signal, (i.e. a digital signal having a sampling rate of f1), of the analog-to-digital converter ADC 500 to prevent aliasing. The third decimator 580 further includes a third down-sampler 584 for down-sampling the digital signal passed through the fifth low pass filter (LPF5) 382. For example, the third down-sampler 584 converts the sampling rate f1 of the digital signal outputted from the fifth low pass filter (LPF5) 382 with a down-sampling factor of 1/R3 (R3 is an integer).

The third sample rate converter 590 converts the sampling rate of an output signal from the third decimator 580 with a conversion factor of M3/L3. The third sample rate converter 590 includes a third up-sampler 592 for up-sampling the sampling rate of the output signal from the third decimator 580 with an up-sampling factor of M3.

The third sample rate converter 590 further includes a sixth low pass filter (LPF6) 594 for filtering an output of the third up-sampler 592 so as to prevent the aliasing. An output signal of the sixth low pass filter (LPF6) 596 is inputted to a sixth down-sampler 596. The sixth down-sampler 596 down-samples the sampling rate of the output signal of the sixth low pass filter (LPF6) 596 with a down-sampling factor of L3. Therefore, the sampling rate of the output signal of the third decimator 580 is converted with the conversion factor M3/L3.

In this embodiment, the third digital front end 570 is dedicated to processing cdma-2000 signals. When operating according to the cdma-2000 standard, the digital baseband processor 598 samples an input or an output signal at a sampling rate of about 1.2288×N3 (N3 is an integer greater than one) Msps. Thus, the sampling rate f1/R3×M3/L3 (where R3, M3, and L3 are integers greater than one) of a signal inputted to the digital baseband processor 598 equals 1.2288×N3 Msps.

Thus, according to the example embodiment of the invention in FIG. 5, the GSM/EDGE signal, the W-CDMA signal and the cdma-2000 signal may be alternately processed, using a single analog to digital converter (ADC) 500. For example, the cdma-2000 signal may be processed by the third digital front end 570 while inactivating first and second digital front ends 410 and 440.

To use the common digital-to-analog converter (ADC) 500 for three communication systems described above, the respective variables for the sampling rates may be selected in a manner similar as described above with reference to selection of variables for the converters of FIG. 4.

The respective variables should satisfy the following Expression 2.

$$f1 = 1.625 \times 10^6 / N1 \times R1 / M1 \times L1 \quad \text{[Expression 2]}$$
$$= 3.84 \times 10^6 \times N2 \times R2 / M2 \times L2$$
$$= 1.2288 \times 10^6 \times N3 \times R3 / M3 \times L3$$

wherein f1 denotes the sampling frequency of the analog-to-digital converter 500.

The following table 3 shows respective sets of the variables satisfying Expression 2 when N1 is set to 6, N2 to 2 and N3 to 2 and the sampling rate f1 of the analog-to-digital converter 500 is set to be greater than or equal to about 25 MHz and less than about 35 MHz.

TABLE 3

| f1(MHz) | R1 | M1 | L1 | R2 | M2 | L2 | R3 | M3 | L3 |
|---|---|---|---|---|---|---|---|---|---|
| 28.4444 | 64 | 39 | 64 | 10 | 27 | 10 | 25 | 54 | 25 |
| 32 | 32 | 13 | 48 | 5 | 6 | 5 | 25 | 48 | 25 |
| 32 | 48 | 13 | 32 | 5 | 6 | 5 | 25 | 48 | 25 |
| 33.28 | 48 | 25 | 64 | 12 | 3 | 1 | 25 | 24 | 13 |
| 33.28 | 64 | 25 | 48 | 1 | 3 | 13 | 25 | 24 | 13 |
| 33.28 | 64 | 25 | 48 | 12 | 3 | 1 | 25 | 24 | 13 |

Figure 6:
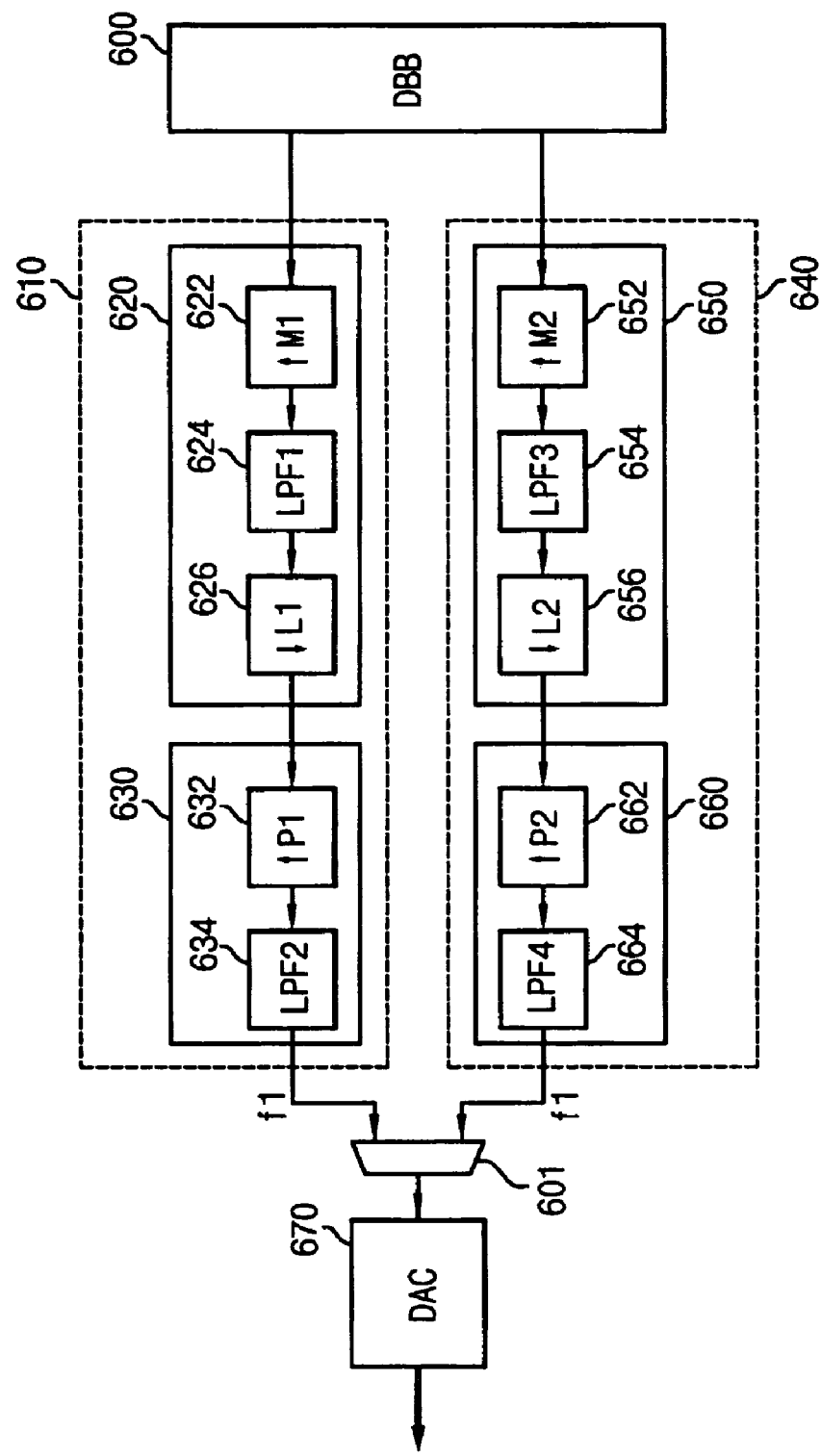
FIG. 6 is a block diagram illustrating an analog baseband processor in a multimode transmitter according to still another example embodiment of the invention.

FIG. 6 is a block diagram illustrating an analog baseband processor in a multimode transmitter according to another example embodiment of the invention.

Referring to FIG. 6, the analog baseband processor in a multimode transmitter includes a first digital front end 610, a second digital front end 640, a switching unit (e.g., multiplexer) 601 and a single analog-to-digital converter 670.

The first digital front end 610 includes a first sample rate converter 620 and a first interpolator 630 to convert a sampling rate of a first digital signal output by the digital baseband processor 600 with a fractional factor.

For example, the first sample rate converter 620 includes a first up-sampler 622 for up-sampling the first digital input signal with an up-sampling factor of M1, a first low pass filter 624 for preventing aliasing in the up-converted first digital input signal, and a first down-sampler 626 for down-sampling the sampling rate of an output signal of the first low pass filter 624 with a down-sampling factor of L1.

The first interpolator 630, compensates for samples down-sampled by the first down-sampler 626. Therefore, the interpolator may generally have similar or substantially the same functions as an up-sampler. The first interpolator 630 may include a second up-sampler 632, which has an up-sampling factor of P1, for compensating the samples down-sampled by the first down-sampler 626, and a second low pass filter 634 for preventing aliasing.

A digital signal passing through the second low pass filter 634 has a sampling rate (frequency) of f1 and is inputted to the digital-to-analog converter (DAC) 670 (through the switching unit 601) to be processed by an RF processor (not shown) or an IF processor (not shown). To provide signals at the sampling rate f1 to the digital-to-analog converter (DAC) 670, the sampling rate of the digital baseband processor 600 is required to be f1×L1/(M1×P1).

The second digital front end 640 includes a second sample rate converter 650 and a second interpolator 660, for converting the sampling rate of a second digital input signal output from the digital baseband processor 600, with a fractional factor.

The second sample rate converter 650 includes a third up-sampler 652 for up-sampling the second digital input signal output from the digital baseband processor 600 with an up-sampling factor of M2, a third low pass filter (LPF3) 654 for preventing aliasing and a second down-sampler 656 for down-sampling the sampling rate of an output signal of the third low pass filter 654 with a down-sampling factor of L2.

The second interpolator 660 compensates for samples down-sampled by the second down-sampler 656. The second interpolator 660 may include a fourth up-sampler 662, which has an up-sampling factor of P2, for compensating the samples down-sampled by the second down-sampler 656 and a fourth low pass filter (LPF4) 664 for preventing aliasing.

A digital signal passing through the fourth low pass filter (LPF4) 664 has a sampling rate of f1 and is inputted to the digital-to-analog converter 670 (through the switching unit 601) to be processed by the RF processor or the IF processor (not shown). To convert the sampling rate of the digital signal of the digital baseband processor 600 to the sampling rate f1 of the digital-to-analog converter 670, the sampling rate of the digital baseband processor 600 is required to be f1×L2/(M2×P2).

Thus, when GSM/EDGE and W-CDMA signals are selectively inputted to the digital-to-analog converter (DAC) 670 (and converted to analog signals for the purpose of modulation), the sampling rate f1 satisfies the following expression 3.

$$f1 = 1.625 \times 10^6 / N1 \times P1 \times M1 / L1 \quad \text{[Expression 3]}$$
$$\text{(in case of } GSM/\text{EDGE signal)}$$
$$= 3.84 \times 10^6 \times N2 \times P2 \times M2 / L2$$
$$\text{(in case of } W/\text{CDMA signal)}$$

Additionally, the analog baseband processor according to the example embodiments of the invention may be employed in various communication systems such as GSM/EDGE, W-CDMA, cdma-2000, GPS, Bluetooth, W-LAN.

Further, the above respective variables may be selected according to the same criteria described in the example embodiment in FIG. 4 for the purpose of easy implement of a filter and the decreased hardware complexity or for greatest accuracy of signal transmission).

Figure 7:
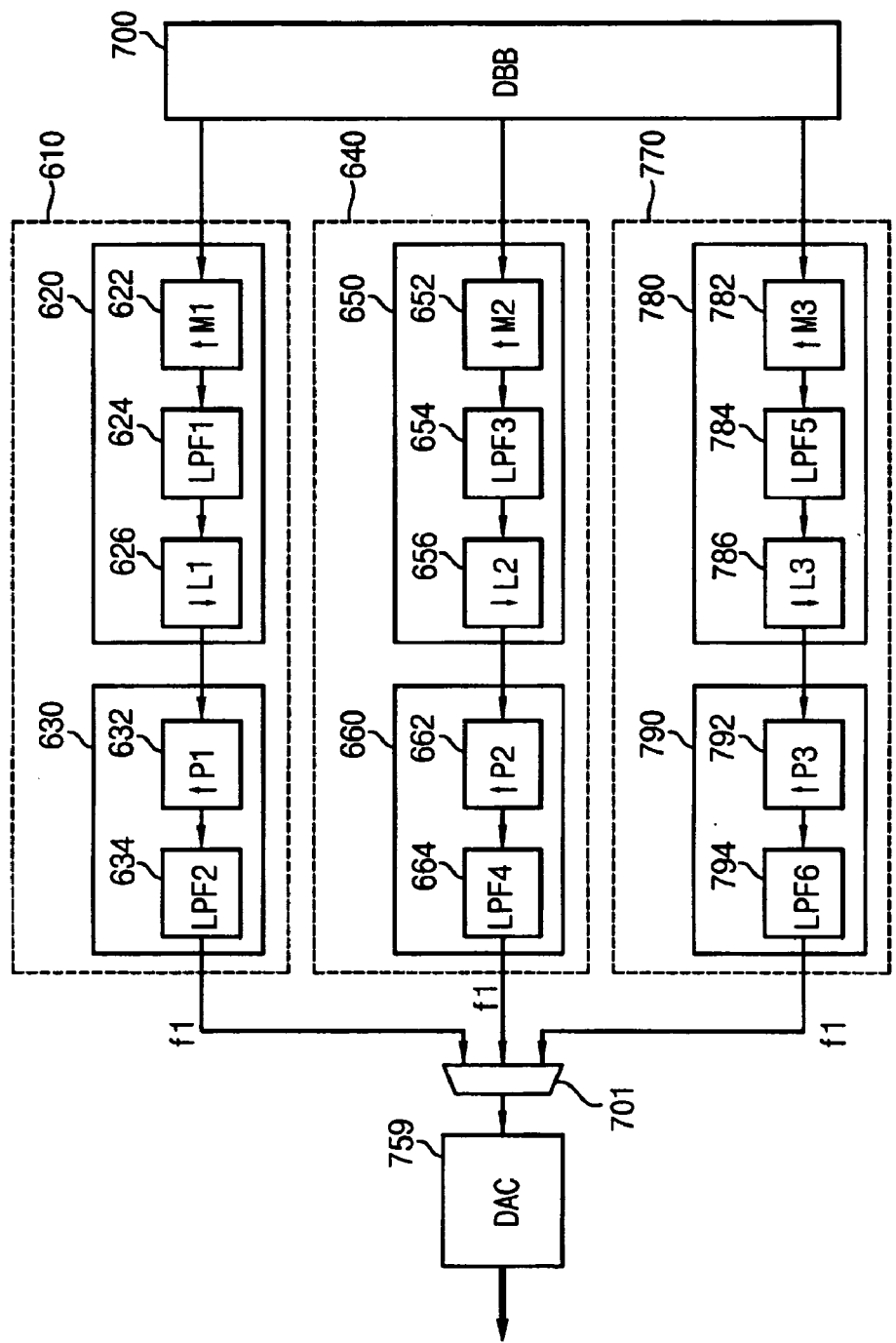
FIG. 7 is a block diagram illustrating an analog baseband processor in a multimode transmitter according to still another example embodiment of the invention.

FIG. 7 is a block diagram illustrating an analog baseband processor in a multimode transmitter according to still another example embodiment of the invention.

Referring to FIG. 7, the analog baseband processor in the multimode transmitter may be the same as the analog baseband processor in FIG. 6 except for a greater switching unit (e.g., multiplexer) 701 and an additional (third) digital front end 770 (e.g., for processing a cdma-2000 signal). The same reference numerals denote similar or identical elements in FIG. 6. Therefore, only the switching unit 701 and the third digital front end 770 of FIG. 7 will be described and the description of the first and second digital front ends 610 and 640 (e.g., for processing the GSM signal and the W-CDMA signal) will be omitted.

The third digital front end 770 includes a third sample rate converter 780 for converting a sampling rate f1 of a third digital input signal output from a digital baseband processor 700 with a fractional factor, and a third interpolator 790.

The third sample rate converter 780 includes a fifth up-sampler 782 for up-sampling the third digital signal with an up-sampling factor of M3, a fifth low pass filter (LPF5) 784 for preventing aliasing and a fifth down-sampler 786 for down-sampling a sampling rate of an output signal of the fifth low pass filter 784 with a down-sampling factor of L3.

The third interpolator 790 compensates for samples down-sampled by the fifth down sampler 786. For example, the fifth interpolator 790 includes a sixth up-sampler 792, which has an up-sampling factor of P3, for compensating the samples down-sampled by the fifth down-sampler 786, and a sixth low pass filter (LPF6) 794 for preventing aliasing.

A digital signal passing through the sixth low pass filter (LPF6) 794 has a sampling rate of f1 and is inputted to the digital-to-analog converter (DAC) 759 (through the switching unit 701) to be processed by an RF processor (not shown) or IF processor (not shown). To convert the sampling rate of the digital signal of the digital baseband processor 700 to the sampling rate f1 of the digital-to-analog converter (DAC) 795 to, the sampling rate of the digital baseband processor 700 is required to be f1/P3×L3/M3.

Therefore, the respective digital front ends shown in FIG. 7 may alternately process three kinds (modes) of digital signals using a single common digital-to-analog converter (DAC) 795, and may transmit the processed signals to the RF processor or the IF processor (not shown).

For example, when the three kinds of the digital signals include GSM/EDGE, W-CDMA, cdma-2000 signals, the variables may be selected to satisfy the following Expression 4.

$$f1 = 1.625 \times 10^6 / N1 \times P1 \times M1 / L1 \quad \text{[Expression 4]}$$

(in case of *GSM*/EDGE signal)

$$= 3.84 \times 10^6 \times N2 \times P2 \times M2 / L2$$

(in case of W/CDMA signal)

$$= 1.2288 \times 10^6 \times N3 \times P3 \times M3 / L3$$

(in case of *cdma*-2000 signal)

Further, the analog baseband processor according to the example embodiment of FIG. 7 may also be employed in various communication systems such as GSM/EDGE, W-CDMA, cdma-2000, GPS, Bluetooth, W-LAN, etc.

Figure 8:
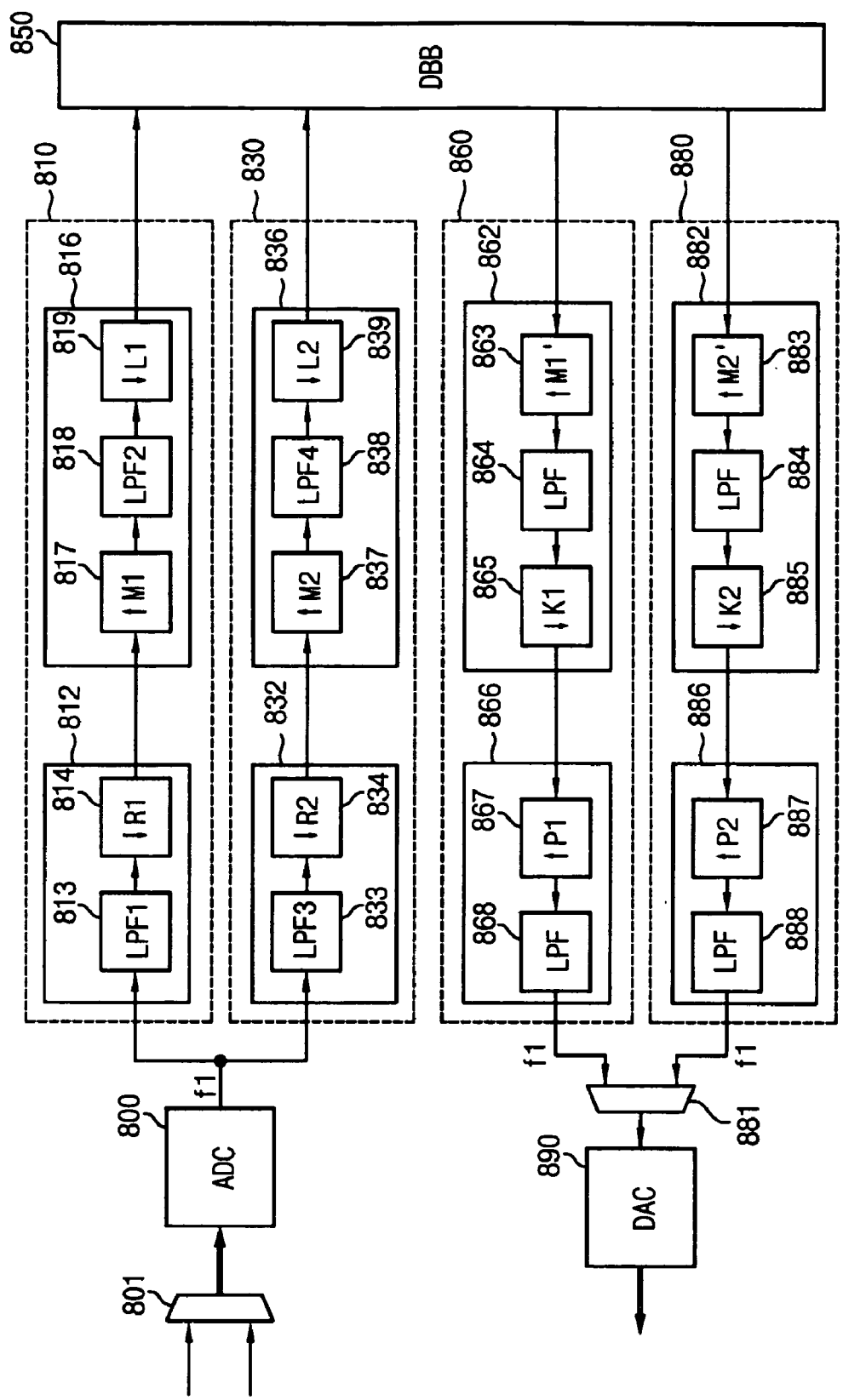
FIG. 8 is a block diagram illustrating an analog baseband processor in a multimode receiver/transmitter according to still another example embodiment of the invention.

FIG. 8 is a block diagram illustrating an analog baseband processor in a multimode receiver/transmitter according to still another example embodiment of the invention.

Referring to FIG. 8, the analog baseband processor in the multimode receiver/transmitter includes a first switching unit (e.g., multiplexer) 801, a first analog-to-digital converter (ADC) 800 for converting first and second mode input signals to digital signals, first and second receiver digital front ends 810 and 830 for alternately processing the received digital signals. The analog baseband processor in the multimode receiver/transmitter further includes first and second transmitter digital front ends 860 and 880 for selectively processing output signals of a digital baseband processor 850, a second switching unit (e.g., multiplexer) 881 and a digital-to-analog converter (DAC) 890 for converting output signals of the first and second transmitter digital front end 860 and 880 to first and second analog output signals, respectively.

The analog-to-digital converter (ADC) 800, and the first and second receiver digital front ends 810 and 830, have configuration and function the same or similar to the corresponding elements described in FIG. 4.

The first receiver digital front end 810 includes a first decimator 812 and a second sample rate converter 816. For example, the first decimator 812 includes a first low pass filter (LPF1) 813 and a first down-sampler 814. Additionally, the first sample rate converter 816 includes a first up-sampler 817, a second low pass filter (LPF2) 818 and a second down-sampler 819. Similarly, the receiver second digital front end 830 includes a second decimator 832 and a second sample rate converter 836. For example, the second decimator 832 includes a third low pass filter (LPF3) 833 and a third down-sampler 834. Additionally, the second sample rate converter 836 includes a second up-sampler 837, a fourth low pass filter (LPF4) 838 and a fourth down-sampler 839.

The receiver digital front ends 810 and 830 operate according to respective selected communication protocols. A method of alternatively processing two different signals using a common analog-to-digital converter 800 is the same as the method described with reference to FIG. 4.

The first and second transmitter digital front ends 860 and 880 and the digital-to-analog converter (DAC) 890 have configurations and functions similar to the corresponding elements described in FIG. 6.

The first transmitter digital front end 860 includes a third decimator 862 and a first interpolator 866. For example, the third decimator 862 includes a third up-sampler 863, a fifth low pass filter (LPF) 864 and a fifth down-sampler 865. The first interpolator 866 includes a fourth up-sampler 867 and a sixth low pass filter (LPF) 868.

The second transmitter digital front end 880 includes a fourth decimator 882 and a second interpolator 886. The fourth decimator 882 includes a fifth up-sampler 883, a seventh low pass filter (LPF) 884 and a sixth down-sampler 885. The second interpolator 886 includes a sixth up-sampler 887 and a sixth low pass filter (LPF) 888.

In alternative embodiments, the analog baseband processor in the multimode receiver/transmitter of FIG. 8 may further include a third receiver digital front end (connected between ADC 800 and DBB 850) for processing and a third transmitter digital front end (connected between DAC 890 and DBB 850), so that signals complying with any three of the GSM/EDGE, W-CDMA, CDMA-2000, GPS, Bluetooth, W-LAN standards may be processed by the analog baseband processor. In that case, the receiver digital front ends may have the same configuration as that of the receiver digital front ends of FIG. 5, and the transmitter digital front ends may have the same configuration as that of the transmitter digital front ends of FIG. 7.

When the receiver digital front ends 810 and 830 are defined to alternately process GSM/EDGE and W-CDMA signals, the transmitter digital front ends 860 and 880 may also be defined to process the same signals (GSM/EDGE and W-CDMA signals).

Further, to alternately process signals of communication systems complying with different communication standards, the analog baseband processor in the receiver/transmitter can include the receiver digital front end and transmitter digital front end for processing signals complying with those communication standards.

As described above, the analog baseband processor according to the example embodiments of the invention, the sampling frequency (or sampling rate) of the analog baseband processor may be predetermined so as to satisfy various combinations of communication protocols (GSM/EDGE, W-CDMA, CDMA-2000, GPS, Bluetooth, W-LAN, etc), and the multi-mode (or dual mode) receiver (or transmitter or transceiver) may be implemented using only one analog-to-digital converter (or one digital-to-analog converter), thereby reducing hardware complexity of the receiver (or transmitter or transceiver).

Therefore, signal processing may be implemented more efficiently with a simpler hardware employed.

Having thus described example embodiments of the invention, it is to be understood that the invention defined by the appended claims is not to be limited by particular details set forth in the above description as many apparent variations thereof are possible without departing from the spirit or scope thereof as hereinafter claimed.

What is claimed is:

1. An analog baseband processor for use in a communication device, the analog baseband processor comprising:
   an analog-to-digital converter configured to alternately sample a first mode input signal to output a first digital signal at a first sampling rate, and to sample a second mode input signal to output a second digital signal at the first sampling rate, wherein the first mode input signal has a first symbol frequency (FS1), and the second mode input signal has a second symbol frequency (FS2);
   a first decimator configured to reduce the first sampling rate of the first digital signal with a conversion factor of R1, R1 being an integer;
   a first sample rate converter configured to convert the reduced sampling rate of an output signal of the first decimator with a conversion factor of M1/L1, M1 and L1 being integers;
   a second decimator configured to reduce the first sampling rate of the second digital signal with a conversion factor of R2, R2 being an integer; and
   a second sample rate converter configured to convert the sampling rate of an output signal of the second decimator with a conversion factor of M2/L2, M2 and L2 being integers;
   wherein the first sampling rate×M1/(R1×L1) equals the first symbol frequency (FS1) of the first mode input signal times a first oversampling factor;
   wherein the first symbol frequency (FS1) of the first mode input signal conforming to a GSM/EDGE standard times a first oversampling factor, equals about 1.625/N1 Msps (Mega samples per second), wherein N1 is an integer greater than one;
   wherein the first sampling rate×M2/(L2×R2) equals the second symbol frequency (FS2) of the second mode input signal times a second oversampling factor; and
   wherein the second symbol frequency (FS2) in conformity to a W-CDMA standard times the second oversampling factor equals about 3.84×N2 Msps (Mega samples per second).

2. The analog baseband processor of claim 1, wherein N1,N2, R1, M1, L1,R2, M2 and L2 are such that $1.625 \times 10^6 \times (L1 \times R1)/(M1 \times N1) = 3.84 \times 10^6 \times (L2 \times R2 \times N2)/M2$.

3. The analog baseband processor of claim 2, wherein N1, N2, R1, M1, L1, R2, M2 and L2 are such that M1 and M2 are as small as possible.

4. An analog baseband processor for use in a communication device, the analog baseband processor comprising:
   an analog-to-digital converter configured to alternately sample a first mode input signal to output a first digital signal at a first sampling rate, to sample a second mode input signal to output a second digital signal at the first sampling rate, wherein the first mode input signal has a first symbol frequency (FS1), and the second mode input signal has a second symbol frequency (FS2), and wherein FS1 and FS2 are not equal to the first sampling rate nor equal to each other nor equal to any integer multiple of the other; and wherein the analog-to-digital converter is further configured to alternately convert a third mode input signal to a third digital signal at the first sampling rate, wherein the third mode input signal has a third symbol frequency (FS3), wherein FS3 is not equal to FS1 nor equal to FS2;
   a first decimator configured to reduce the first sampling rate of the first digital signal with a conversion factor of R1, R1 being an integer;
   a first sample rate converter configured to convert the reduced sampling rate of an output signal of the first decimator with a conversion factor of M1/L1, M1 and L1 being integers;
   a second decimator configured to reduce the first sampling rate of the second digital signal with a conversion factor of R2, R2 being an integer;
   a second sample rate converter configured to convert the sampling rate of an output signal of the second decimator with a conversion factor of M2/L2, M2 and L2 being integers;
   a third decimator configured to reduce the sampling rate of the third digital signal with a conversion factor of R3, R3 being an integer; and
   a third sample rate converter configured to convert a sampling rate of an output signal of the third decimator with a conversion factor of M3/L3, M3 and L3 being integers.

5. The analog baseband processor of claim 4, wherein the first sampling rate×M1/(L3×R3) equals about 1.2288×N3 Msps (Mega samples per second) conforming to a CDMA-2000 standard, where N3 is an integer greater than one.

6. The analog baseband processor of claim 5, wherein the first sampling rate and N1, N2, N3, R1, M1, L1, R2, M2, L2, R3, M3 and L3 satisfy the condition: the first sampling rate=$1.625 \times 10^6 \times (R1 \times L1)/(M1 \times N1) = 3.84 \times 10^6 \times (N2 \times L2 \times R2)/M2 = 1.2288 \times 10^6 \times (N3 \times R3 \times L3)/M3$.

7. The analog baseband processor of claim 4, wherein the first receiver digital front end processes the first mode input signal corresponding to a GSM standard, the second receiver digital front end processes the second mode input signal corresponding to a W-CDMA standard, and the third receiver digital front end processes the third mode input signal corresponding to a cdma-2000 standard.

8. An analog baseband processor for use in a communication device, the analog baseband processor comprising:
- a first transmitter digital front end configured to convert a first sampling rate of a first digital input signal to an output sampling rate, so that the output signal of the first transmitter digital front end has the output sampling rate;
- a second transmitter digital front end configured to convert a second sampling rate of a second digital input signal to the output sampling rate, and the output signal of the second transmitter digital front end has the output sampling rate; and
- a digital-to-analog converter configured to convert an output signal of the first transmitter digital front end to a first analog output signal and to convert an output signal of the second transmitter digital front end to a second analog Output signal, wherein the first analog output signal has a first symbol frequency (FS1), and the second analog output signal has a second symbol frequency (FS2), and wherein FS1 and FS2 are not equal to the first sampling rate nor equal to each other nor equal to any integer multiple of the other;

wherein the first transmitter digital front end includes:
a first sample rate converter configured to convert the first sampling rate of the first digital input signal with a conversion factor of M1/L1, M1 and L1 being integers; and
a first interpolator configured to convert a sampling rate of an output signal of the first sample rate converter with a conversion factor of P1, P1 being an integer;

wherein the first sampling rate equals about $1.625 \times (P1 \times M1)/(L1 \times N1)$ Msps (Mega samples per second) conforming to a GSM/EDGE standard, where N1 is an integer greater than one.

9. The analog baseband processor of claim 8, wherein the second transmitter digital front end includes:
- a second sample rate converter configured to convert the second sampling rate of the second digital input signal with a conversion factor of M2/L2, M2 and L2 being integers; and
- a second interpolator configured to convert a sampling rate of an output signal of the second sample rate converter with a conversion factor of P2, P2 being an integer.

10. The analog baseband processor of claim 9, wherein the first sampling rate equals about $3.84 \times (N2 \times P2 \times M2)/L2$ Msps (Mega samples per second) where N2 is an integer greater than one.

11. An analog baseband processor for use in a communication device, the analog baseband processor comprising:
- a first transmitter digital front end configured to convert a first sampling rate of a first digital input signal to an output sampling rate, so that the output signal of the first transmitter digital front end has the output sampling rate;
- a second transmitter digital front end configured to convert a second sampling rate of a second digital input signal to the output sampling rate, and the output signal of the second transmitter digital front end has the output sampling rate; and
- a digital-to-analog converter configured to convert an output signal of the first transmitter digital front end to a first analog output signal and to convert an output signal of the second transmitter digital front end to a second analog output signal, wherein the first analog output signal has a first symbol frequency (FS1), and the second analog output signal has a second symbol frequency (FS2), and wherein FS1 and FS2 are not equal to the first sampling rate nor equal to each other nor equal to any integer multiple of the other; wherein the first transmitter digital front end includes:
  - a first sample rate converter configured to convert the first sampling rate of the first digital input signal with a conversion factor of M1/L1, M1 and L1 being integers; and
  - a first interpolator configured to convert a sampling rate of an output signal of the first sample rate converter with a conversion factor of P1, P1 being an integer; wherein the second transmitter digital front end includes:
    - a second sample rate converter configured to convert the second sampling rate of the second digital input signal with a conversion factor of M2/L2, M2 and L2 being integers; and
    - a second interpolator configured to convert a sampling rate of an output signal of the second sample rate converter with a conversion factor of P2, P2 being an integer;
  wherein the first sampling rate equals about $3.84 \times (N2 \times P2 \times M2)/L2$ Msps (Mega samples per second) conforming to a W-CDMA standard, where N2 is an integer greater than one.

12. The analog baseband processor of claim 11, wherein N1, N2, P1, M1, L1, P2, M2 and L2 are such that $1.625 \times (P1 \times M1)/(L1 \times N1)$ equals $3.84 \times (N2 \times P2 \times M2)/L2$.

13. The analog baseband processor for use in a communication device, the analog baseband processor comprising:
- a first transmitter digital front end configured to convert a first sampling rate of a first digital input signal to an output sampling rate, so that the output signal of the first transmitter digital front end has the output sampling rate;
- a second transmitter digital front end configured to convert a second sampling rate of a second digital input signal to the output sampling rate, and the output signal of the second transmitter digital front end has the output sampling rate;
- a digital-to-analog converter configured to convert an output signal of the first transmitter digital front end to a first analog output signal and to convert an output signal of the second transmitter digital front end to a second analog output signal, wherein the first analog output signal has a first symbol frequency (FS1), and the second analog output signal has a second symbol frequency (FS2), and wherein FS1 and FS2 are not equal to the first sampling rate nor equal to each other nor equal to any integer multiple of the other; and
- a third transmitter digital front end that converts a third sampling rate of a third digital input signal to the output sampling rate, the analog-to-digital converter converts an output signal of the third transmitter digital front end to a third analog signal, and the third sampling rate is different from the first sampling rate and the second sampling rate.

14. The analog baseband processor of claim 13, wherein the digital-to-analog converter alternately receives a selected one of the output signals of the first transmitter digital front end, of the output signal of the second transmitter digital front end, and of the output signal of the third transmitter digital front end, and converts the selected received output signal to a corresponding one the first analog signal, the second analog signal, or the third analog signal, respectively.

15. The analog baseband processor of claim 13,
wherein the first transmitter digital front end includes:
- a first sample rate converter configured to convert the first sampling rate of the first digital input signal with a conversion factor of M1/L1, M1 and L1 being integers; and
- a first interpolator configured to convert a sampling rate of an output signal of the first sample rate converter with a conversion factor of P1, P1 being an integer;

wherein the second transmitter digital front end includes:
- a second sample rate converter configured to convert the second sampling rate of the second digital input signal with a conversion factor of M2/L2, M2 and L2 being integers; and wherein the third transmitter digital front end includes:
- a third sample rate converter configured to convert a sampling rate of the third digital input signal with a conversion factor of M3/L3, M3 and L3 being integers; and
- a third interpolator configured to convert a sampling rate of an output signal of the third sample rate converter with a conversion factor of P3, P3 being an integer.

16. The analog baseband processor of claim 15, wherein the first sampling rate M3/(L3×P3) equals about 1.2288×N3 Msps (Mega samples per second) conforming to a CDMA-2000 standard, where N3 is an integer greater than one.

17. The analog baseband processor of claim 15 wherein the first sampling rate and N1, N2, N3, P1, M1, L1, P2, M2, L2, P3, M3 and L3 satisfy the condition: the first sampling rate=$1.625 \times 10^6 \times (P1 \times M1)/(L1 \times N1) = 3.84 \times 10^6 \times (N2 \times P2 \times M2)/L2 = 1.2288 \times 10^6 \times (N3 \times P3 \times M3)/L3$, where N1, N2, and N3 are integers.

18. The analog baseband processor of claim 17, wherein N1, N2, R1, M1, L1, R2, M2 and L2 are such that M1 and M2 are as small as possible.

19. A method of processing an analog baseband for use in a communication system, the method comprising:
- alternately converting a first mode input signal to a first digital signal at a first sampling rate using an analog-to-digital converter operating at a higher sampling rate and converting a second mode input signal to a second digital signal at the first sample rate using the analog-to-digital converter operating at the same higher sampling rate, and converting a third mode input signal to a third digital signal at the first sample rate using the analog-to-digital converter operating at the same higher sampling rate;

wherein the first mode input signal has a first symbol frequency (FS1), and the second mode input signal has a second symbol frequency (FS2), and the third mode input signal has a second symbol frequency (FS3), and wherein FS1, F2 and FS3 are not equal to the first sampling rate nor equal to each other nor equal to any integer multiple of the other, and no ratio of FS1 and FS2 and FS3 to each other is an integer.

20. An analog baseband processor for use in a communication device, the analog baseband processor comprising:
- an analog-to-digital converter configured to alternately sample a first mode input signal to output a first digital signal at a first sampling rate, to sample a second mode input signal to output a second digital signal at the first sampling rate, wherein the first mode input signal has a first symbol frequency (FS1), and the second mode input signal has a second symbol frequency (FS2), and wherein FS1 and FS2 are not equal to the first sampling rate nor equal to each other nor equal to any integer multiple of the other;
- a first decimator configured to reduce the first sampling rate of the first digital signal with a conversion factor of R1, R1 being an integer; and
- a first sample rate converter configured to convert the reduced sampling rate of an output signal of the first decimator with a conversion factor of M1/L1, M1 and L1 being integers;

wherein the first sampling rate M1/(R1×L1) equals the about 1.625/N1 Msps (Mega samples per second) conforming to a GSM/EDGE standard, N1 is an integer greater then one;

wherein the first symbol frequency (FS1) of the first mode input signal conforming to a GSM/EDGE standard times the first oversampling factor, equals about 1.625/N1 Msps (Mega samples per second), wherein N1 is an integer greater than one.

21. The analog baseband processor of claim 20, wherein the first sampling rate×M2/(L2×R2) equals the second symbol frequency (FS2) of the second mode input signal times a second oversampling factor.

22. The analog baseband processor of claim 21, wherein the first sampling rate×M2/(L2×R2) equals the second symbol frequency (FS2) of the second mode input signal times the second oversampling factor.

23. The analog baseband processor of claim 22 wherein M1 and M2 are as small as possible.

* * * * *